(12) United States Patent
Prior

(10) Patent No.: US 6,246,190 B1
(45) Date of Patent: Jun. 12, 2001

(54) INTEGRATED ELECTRON GUN AND ELECTRONICS MODULE

(75) Inventor: Richard Prior, Union City, CA (US)

(73) Assignee: Etec Systems, Inc., Hayward, CA (US)

( * ) Notice: Subject to any disclaimer, the term of this patent is extended or adjusted under 35 U.S.C. 154(b) by 0 days.

(21) Appl. No.: 09/364,837

(22) Filed: Jul. 30, 1999

(51) Int. Cl.$^7$ ........................................... G09G 1/04
(52) U.S. Cl. ............................. 315/382; 315/379
(58) Field of Search ........................... 315/367, 382, 315/384, 379; 250/396, 397, 398, 492; 313/542, 544

(56) References Cited

U.S. PATENT DOCUMENTS

| | | | |
|---|---|---|---|
| 3,795,837 | * 3/1974 | Chang | 315/94 |
| 3,894,271 | * 7/1975 | Pfeiffer et al. | 315/384 |
| 4,153,848 | * 5/1979 | Pease | 250/492 A |
| 4,543,512 | * 9/1985 | Nakasuji et al. | 315/382 |
| 4,703,234 | 10/1987 | Kato | 315/5.41 |
| 4,820,927 | * 4/1989 | Langner et al. | 250/492.2 |

FOREIGN PATENT DOCUMENTS

| | | | |
|---|---|---|---|
| 0 689 224 A1 | 12/1995 | (EP) | H01J/37/73 |
| 2 129 031 | 10/1972 | (FR) | H05K/5/00 |

OTHER PUBLICATIONS

Revell et al., "PSU for a scanning electron microscope," Mar. 1998, Electronic Engineering, GB, vol. 70, No. 855.

* cited by examiner

Primary Examiner—Don Wong
Assistant Examiner—Hoang Nguyen
(74) Attorney, Agent, or Firm—Jung-hua Kuo

(57) ABSTRACT

An electron gun assembly which integrates electronics required to power the electron gun and the electron gun itself in one module in a high voltage operating environment. The assembly has four major sections: interface cables; electronic circuits (active and high voltage); the electron emitter; and a mechanical enclosure for the assembly. The electronics portion of the assembly has two distinct sections: an active electronics section (which contains digital to analog converters, interface to a control computer, and analog outputs terminals to control the high voltage electronics) and a high voltage electronics section (which contains high-voltage multiplying circuits and feedback and filtering elements). These two sections are electrically connected and are present within an internal box at one end of the assembly, or alternately, the high voltage electronics section is disposed below the active electronics section and outside the internal box. The high voltage electronics section, in turn, is electrically connected to the electron emitter by soldered wiring or alternately, by a mating connector. The integration of the major sections of the power supply for the electron emitter with the electron emitter in one assembly eliminates the bulky, complex and expensive cables relied on in previous designs. Additionally, by modularizing the design so that the active electronics (which are the most prone to failure) are present within the internal box located at one end of the assembly, serviceability in the field is made easier.

16 Claims, 5 Drawing Sheets

INTEGRATED ELECTRON GUN AND ELECTRONICS MODULE

FIELD OF THE INVENTION

This invention relates to electron guns, and more specifically, to the electrical connections between a power supply and an associated electron gun.

BACKGROUND

Electron guns are well known to produce electron beams and are used in several fields, including television receivers, scanning electron microscopes, defect detection instruments, VLSI testing equipment and electron beam lithography. The electron gun power supply typically used is a DC high voltage power supply (HYPS). High voltages are required to power the various electrodes, which accelerate, focus, and deflect the electron beams within an electron beam (e-beam) column which is a typical use of an electron gun. Typically, the power supplies operate at a floating potential between 10 kV and 100 kV in, for example, e-beam columns in lithography systems. In many of these applications, the electron gun is an assembly mounted on the upper portion of an electron beam column.

It is a well known deficiency that an interconnecting cable must be used to electrically connect the HVPS to the electron gun (see FIG. 1). Typically, a computer or controller (not shown) controls a module 103 which includes a DC power supply (a HVPS), which in turn supplies a high voltage, and other signals, to an electron gun 105, which is mounted at one end of an electron beam column 107. Being very sensitive to vibration, the electron gun 105 and electron beam column 107 are mounted on a vibration-isolated floating work table 113. Having large, heavy transformers and power conditioning circuits, the module typically weighs 50 to 80 pounds, and thus cannot be mounted directly on the electron gun, but is mounted on a stand-alone structure 115 in contact with the ground (hence, it is often called a rack-mounted HVPS design). A heavy high voltage cable 109 routes the power and signals from the module 103 to the electron gun 105. Vibrations on the ground or from the rack itself can transmit through the heavy, stiff cable to the electron gun and produce vibrations in the electron beam column which is not acceptable when conducting electron beam lithography.

The cable is very expensive, especially when used in conjunction with a Thermal Field Emission (TFE) electron gun, and may represent a significant portion of the cost of the entire system. The cable is expensive in large part because it is difficult to make; the insulation material must be a high-quality silicone rubber, which is free from air pockets which contribute to arcing. Moreover, it must be flexible enough to prevent vibrations, both internally and externally produced by the HVPS, from being transmitted along the cable to the vibration-sensitive electron gun. The heavy, complex mating assemblies 111 between the high voltage cable and the electron gun on one end, and between the cable and the power supply on the other end, must be nearly perfect; if they are not, electrical current will be discharged to the surrounding air (arcing).

Another disadvantage of the cable is its high capacitance. When arcing does occur from the cable, which is at a high operating voltage (for example, 50,000 V) and a high capacitance, a great deal of energy is released. This energy is often transmitted to the electron gun or the HVPS, often resulting in damage to these components.

SUMMARY

According to the present invention, an electron gun suitable for use with a conventional electron beam column integrates electronic circuitry to power the electron gun together with the electron gun itself in one assembly. The electronic circuitry portion of the assembly has two sections: an active electronics section (which contains a digital to analog converter, interface to a control computer, and analog outputs to control the high voltage electronics) and a high voltage electronics section (which contains high-voltage multiplying circuits and feedback and filtering elements).

The electronic circuitry portion of the assembly weighs about 10 pounds in one example, and is seated on top of the electron gun. A DC power supply is used, along with a digital to analog converter, which is more easily serviceable than a large AC power supply. The control computer is electrically connected to the electronic circuits portion of the assembly via a control cable. The entire assembly is housed in a conductive enclosure and is seated on top of an electron beam column.

The most important aspect of the present invention is that it eliminates the bulky, complex, expensive cables relied on in previous HVPS designs to connect the high voltage electronics to the various gun electrodes. The present invention joins the critical electronic circuitry and the electron gun in one integrated assembly, so that design considerations for the electron gun, regarding the cable's diameter and weight, are eliminated. This, in turn, lowers the cost of the assembly. Moreover, the few soldered wires connecting the high voltage electronics to the electron emitter have much lower capacitance than the prior art interconnecting cables, reducing the likelihood of damage to the electron gun or the power supply if arcing does occur. Another feature of the present invention is that its configuration improves serviceability in the field.

Two embodiments of the invention are described. In a first embodiment, the electronic circuits are partitioned into two sections: a control section, which includes the active electronics and is contained within an internal enclosure inside the assembly, and a high voltage electronics section, which has a lower failure rate. The entire control section is field-replaceable. Advantageously, the internal enclosure and its components are easily detached from the high voltage electronics section and the remainder of the electron gun assembly by disconnecting mating connectors. Thus, in this embodiment, the module may be serviced in the field by removal and replacement of the internal enclosure, without disturbing the critical connection between the high voltage electronics and the electron gun.

In a second embodiment, both the control section and the high voltage electronics section are contained within the internal enclosure. However, the field replaceable unit here is the printed circuit boards which contain the active electronics. The active electronics section is electrically connected to the high voltage electronics section and the electron emitter via a standard, low voltage mating connector. This embodiment provides quick, easy replacement of the active electronics section (which is more likely to fail than the high voltage electronics) in the field by disconnecting the printed circuit boards from the mating connector. A removable cap allows access to the active electronics in both embodiments.

The invention and its various embodiments are further discussed along with the following figures and accompanying text.

DETAILED DESCRIPTION

Figure 1:
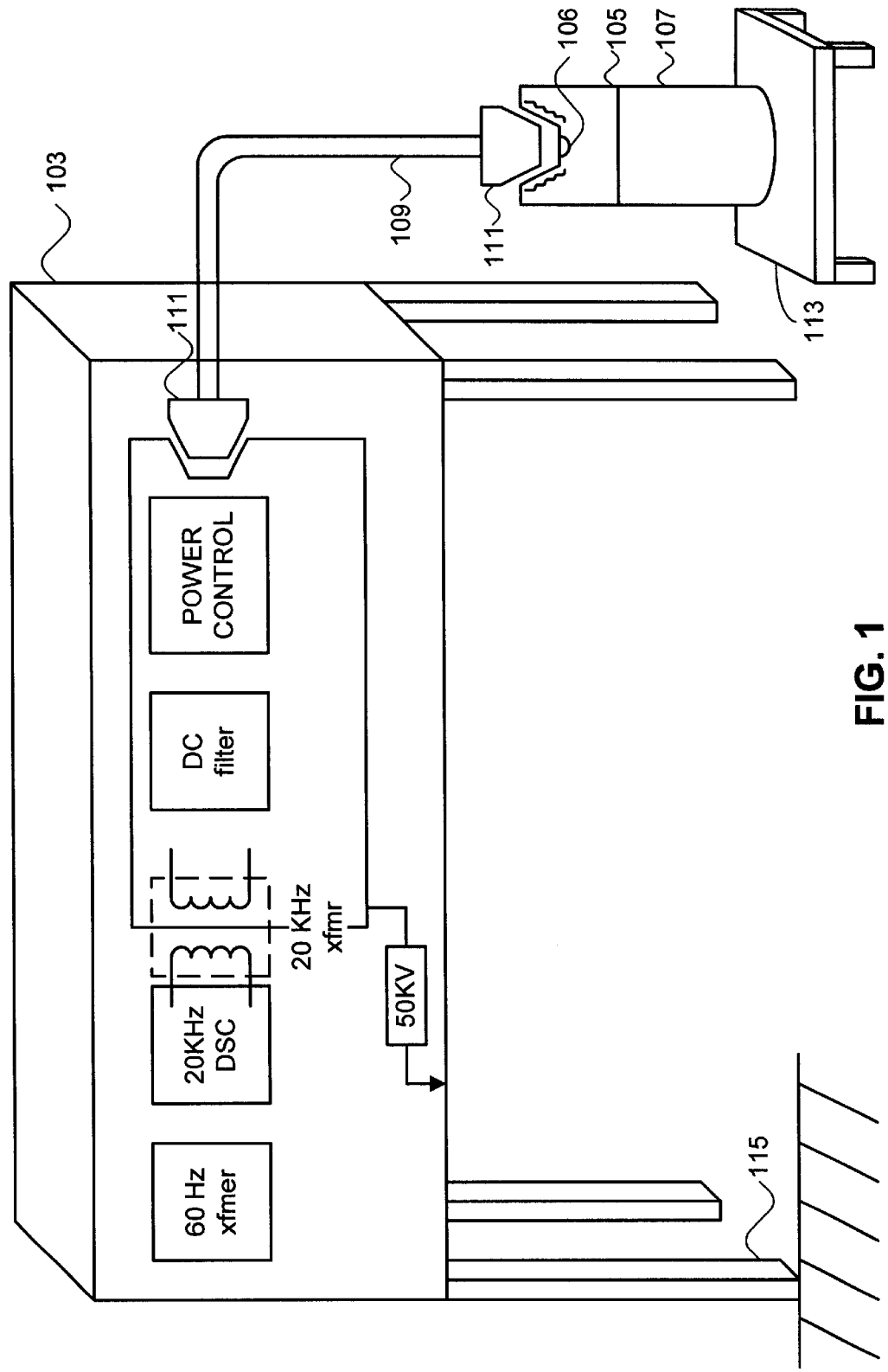
FIG. 1 shows a rack-mounted high voltage power supply (HVPS) connected to an electron gun according to the prior art.
Figure 2:
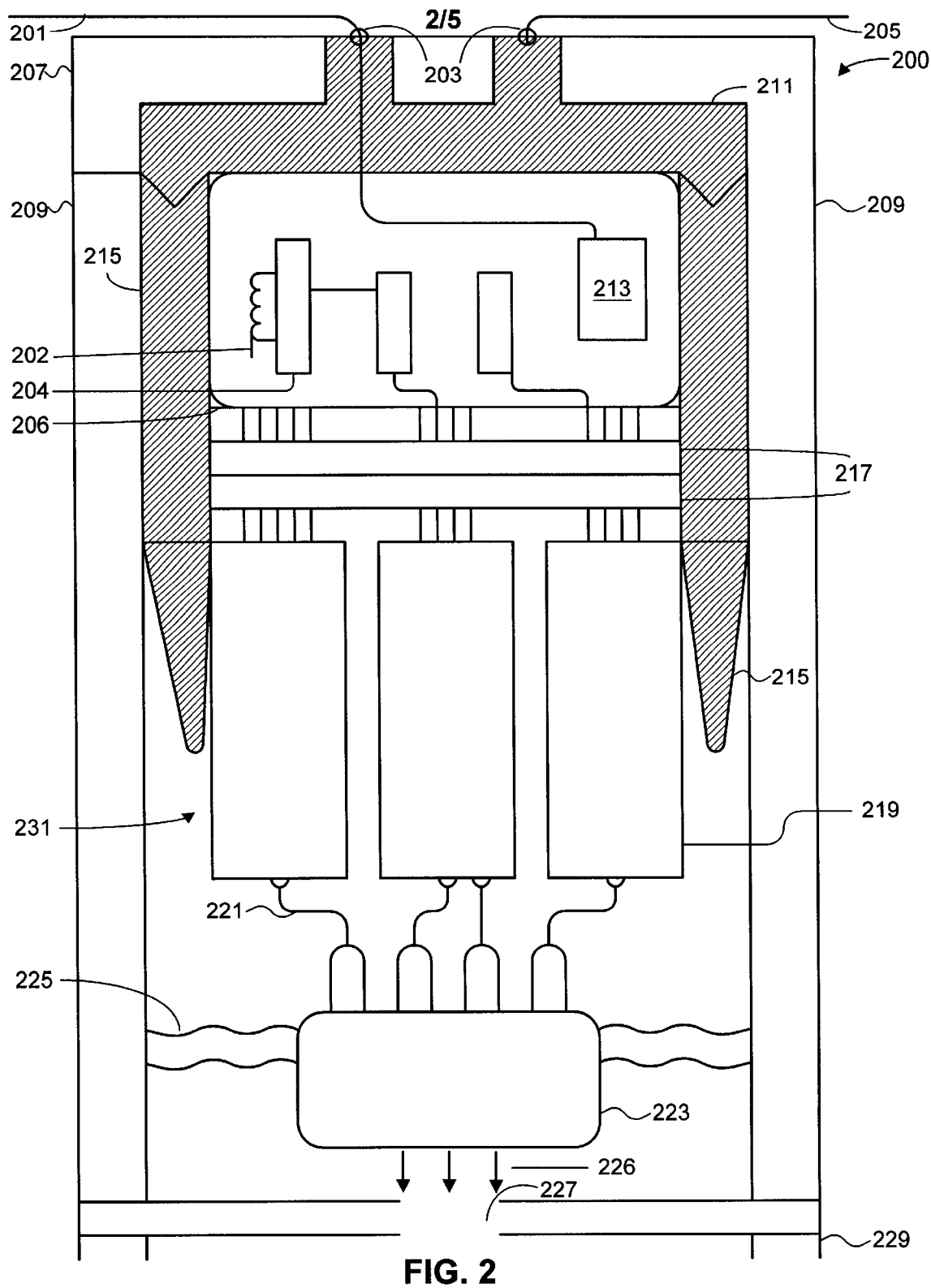
FIG. 2 shows an integrated electron gun and electronics module according to an embodiment of the present invention wherein the control section of the assembly is field replaceable.

FIG. 2 shows in a side view an embodiment of an electron gun and electronics assembly 200 according to the invention. Assembly 200 has four major portions: interface cables; electronic circuits (active and high voltage); an assembly that contains the electron emitter; and a housing (enclosure). In this embodiment, the electronic circuits are in two sections: a control section which includes the active electronics and the high voltage section which has a lower failure rate. The entire control section is a field-replaceable unit.

Interface cables 201 and 205 carry power and control signals to the assembly via feedthroughs 203. The top of the assembly has a removable cap 207, which permits easy access to, and removal of, the control section during maintenance.

Power and conditioning circuits 204 convert the voltage from the secondary winding of an AC transformer 202, which is on the order of 120 V, for example, to a lower DC voltage, on the order of −15 V to 24 V.

All but one of the output terminals of power and conditioning circuits 204 are electrically connected to input terminals of active control circuits 213. One output terminal is electrically connected to ground within the internal enclosure 206 (which is at a potential of, for example, −50 kV). The active control circuits 213 are conventional and may be for example, on printed circuit boards and include digital to analog signal converters, and a logic control module which interfaces with the control computer. The digital to analog signal converters, in turn, have output terminals which are electrically connected to the input terminals of the high voltage multiplying circuits that are part of the high voltage electronics section 219. This connection is partitioned by a mating connector 217. Interface with the control computer is provided via fiberoptic cable 201 and a fiberoptic communications link (not shown), which permits the active control circuits 213 to both transmit data to and receive data from the control computer (not shown). More detailed discussion of this interface is provided with the description of the embodiment in FIG. 3.

The high voltage electronics section 219 includes a plurality of high voltage multiplying circuits having feedback elements, and a filament drive which applies a current to the electron emitter 223. The input terminals of the high voltage multiplying circuits receive an analog signal ranging from 0 V to 10 V from the output terminals of the digital to analog signal converters, and increase this voltage on the order of 1,000 to 5,000 times, so that the signal coming from the output terminals of the high voltage multiplying circuits ranges from 0 V to 50,000 V. The output of the high voltage multiplying circuit having the highest voltage (the 50,000 V unit, for example) is connected to ground within the internal enclosure 206 (which is at a potential of, for example, −50 kV) and to true ground at the housing 209. Thus, power conditioning and control circuits 204 and active control circuits 213 are contained within an internal enclosure 206 which "floats" at a high voltage, typically 50 kV. Internal enclosure 206 is electrically isolated from the housing 209, which is grounded, by insulated supports 215.

The output terminals of other high voltage multiplying circuits (typically 10 kV) are electrically connected to the electron emitter 223 by soldered wiring. Alternatively, a mating connector (not shown) is used to electrically connect the high voltage electronics 219 with the electron emitter assembly 223. Feedback elements which maintain the stability of the high voltage signal from these high voltage multiplying circuits are conventional and are placed downstream of the output terminals in a standard amplifier feedback arrangement. A low pass filter is optional and can also be added downstream of the output of the high voltage multiplying circuits to improve noise characteristics.

When in operation, electrons 226 are emitted from the electron emitter 223 conventionally pass through an aperture 227 to the electron beam column 229.

The entire electron gun assembly is contained within a conductive (metal) housing 209. The housing 209 remains at ground potential, while the electronics and electron emitter operate at a floating potential, typically 10 kV to 100 kV in, for example, electron beam lithography systems. Standoffs 211 and 215 are insulating material, such as potting epoxy, which isolate the high voltage electronics section 219 from ground potential and prevent arcing. Standoffs 215 are oriented in parallel with the major axis of the assembly and mate with standoff 211, which is oriented perpendicular to the major axis of the assembly. These standoffs extend downward into the high voltage electronics section 219, which in one embodiment is immersed in an insulating medium such as HV gel, oil, or Fluorinert™ occupying region 231. Insulating ceramic pieces 225 are located between the electron emitter assembly, which operates at between 10 kV and 100 kV and the conductive walls of the housing, which are at ground potential, to prevent arcing.

Attention must be given to arcing and corona reduction in a high voltage environment, as here. Sharp edges and large differences in voltage potential over a short distance (i.e., exceeding 10 kV/inch) are avoided to prevent arcing. Thus, for example, the wires 221 leading from the high voltage electronics section 219 to the TFE assembly 223 should not have sharp bends, and should be spaced as far apart as possible. Solder connections at both ends of the wiring should be well-rounded. Standoffs 215 terminate not in sharp points, but in rounded ends.

Advantageously, the internal enclosure 206 and its components are easily detached from the high voltage electronics section 219 and the remainder of the electron gun assembly by disconnecting mating connectors 217. Thus, in this embodiment, the module may be serviced in the field by removal and replacement of the internal enclosure, without disturbing the critical connection between the high voltage electronics and the electron gun.

Though FIG. 2 depicts a configuration wherein the active electronics section is disposed above the high voltage electronics section within the assembly, a side-by-side configuration is also possible.

Figure 3A:
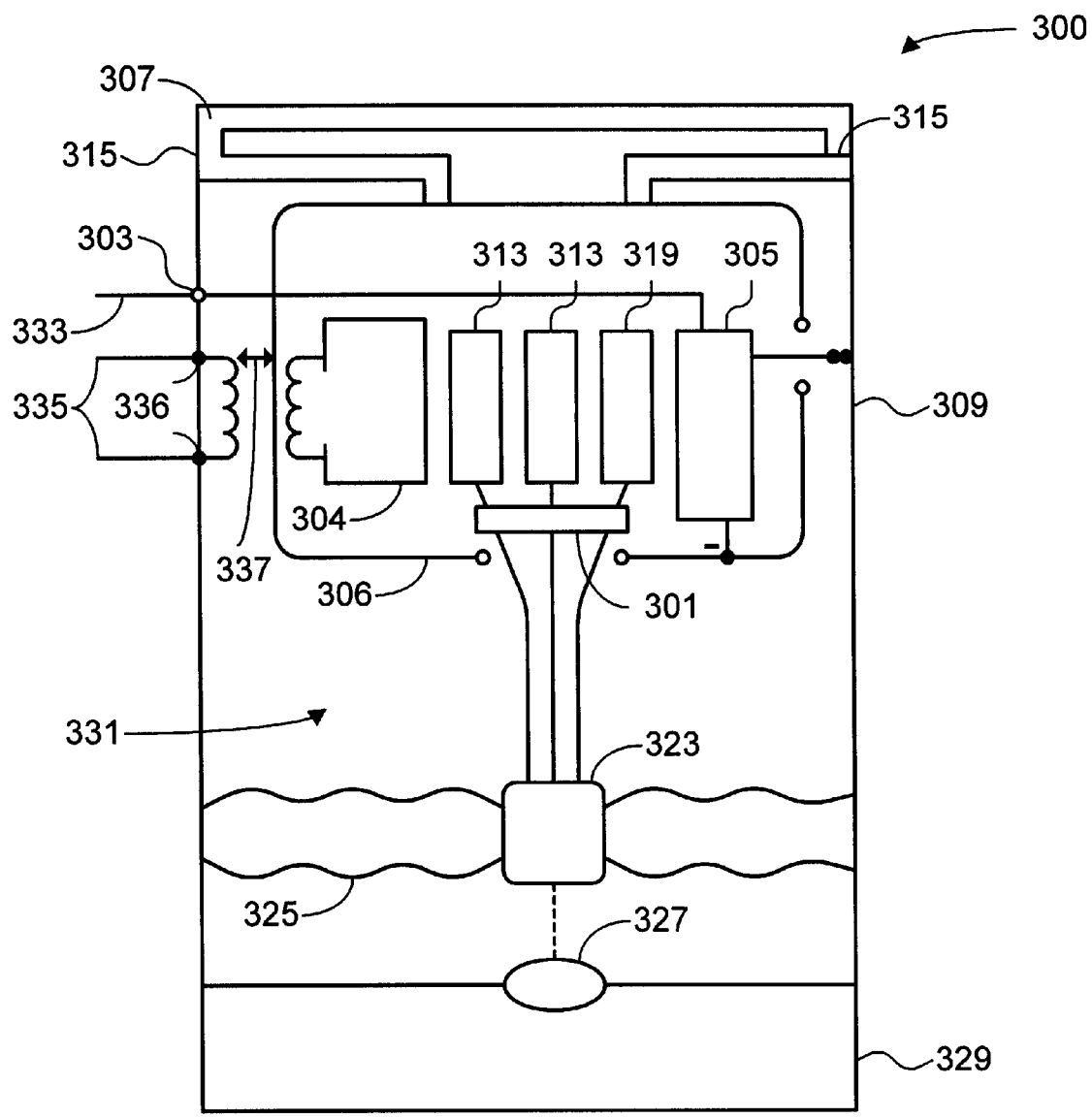
FIG. 3A shows an integrated electron gun and electronics module according to an embodiment of the present invention wherein the active electronics are mounted on printed circuit boards and constitute the field replaceable unit.

FIG. 3A shows in a side view another embodiment of an electron gun and electronics assembly 300 according to the invention. Like the embodiment shown in FIG. 2, it has four major portions: interface cables; electronic circuits (active and high voltage); an assembly that includes the electron emitter; and a housing (enclosure). However, in this embodiment, individual printed circuit boards 313 containing the active control circuits may be removed from the internal enclosure 306 by disconnecting them from connector 301, rather than removing the internal enclosure 306 as a single assembly, as in the embodiment shown in FIG. 2. In addition, printed circuit boards containing the active control circuits are mounted beside high voltage electronics 319, rather than above them.

Both the printed circuit boards 313 containing the active control circuits and high voltage electronics 319 are electrically connected to an electron emitter 323 via wiring and conventional mating connector 301, such as Molex Part No. 79107-0009. Printed circuit boards 313 containing the active control circuits and high voltage electronics 319 are contained, along with power conditioning and control circuits 304 and DC power supply 305, within an internal enclosure 306 which "floats" at a high voltage, typically 50 kV. The electrical connections between the printed circuit boards containing active electronics 313 and high voltage electronics 319 within the internal enclosure 306, and the electron emitter 323 is segmented by connector 301. Advantageously, this permits servicing of the active electronics by simply removing printed circuit boards 313 from the mating connector 301. Internal enclosure 306 is electrically isolated from the housing 309 which is grounded, by insulated supports 315. The area 331 within the module between the internal box and the electrical emitter 323 is filled with an insulating medium such as HV gel, oil, or Fluorinert™.

Electron emitter 323 is, for example, a thermal field emission (TFE) device, operating at a floating potential, typically 50 kV, and is electrically isolated from the housing 309 by high voltage power line insulators 325 which are, for example, of ceramic material. When in operation, electrons are emitted from electron emitter 323 and conventionally pass through aperture 327 into electron beam column 329.

A fiberoptic communications link 333 connects a control computer (not shown) to the active control electronics of the floating assembly 319 via feedthroughs 303 installed in the walls of the outer enclosure 309. Using the fiber optic link maintains the high voltage signal isolation not possible when wire is used as a signal interconnect. Two wires 335 which connect to the primary winding of the power transformer are also passed through comparable feedthroughs, 336. The power transformer 337 maintains sufficient isolation between the primary and secondary windings to standoff the 50 kV typical potential difference. This isolation is commonly achieved through the use of potting epoxy, HV gel, or insulating oil. The main function of the isolation transformer is to transmit sufficient power to the floating electronics to operate the various digital to analog converters, communication circuits, etc. The primary side of the transformer is ground referenced, and the high voltage side, often housed within the walls of the floating assembly 306, is referenced to the high voltage, typically 50 kV.

Figure 3B:
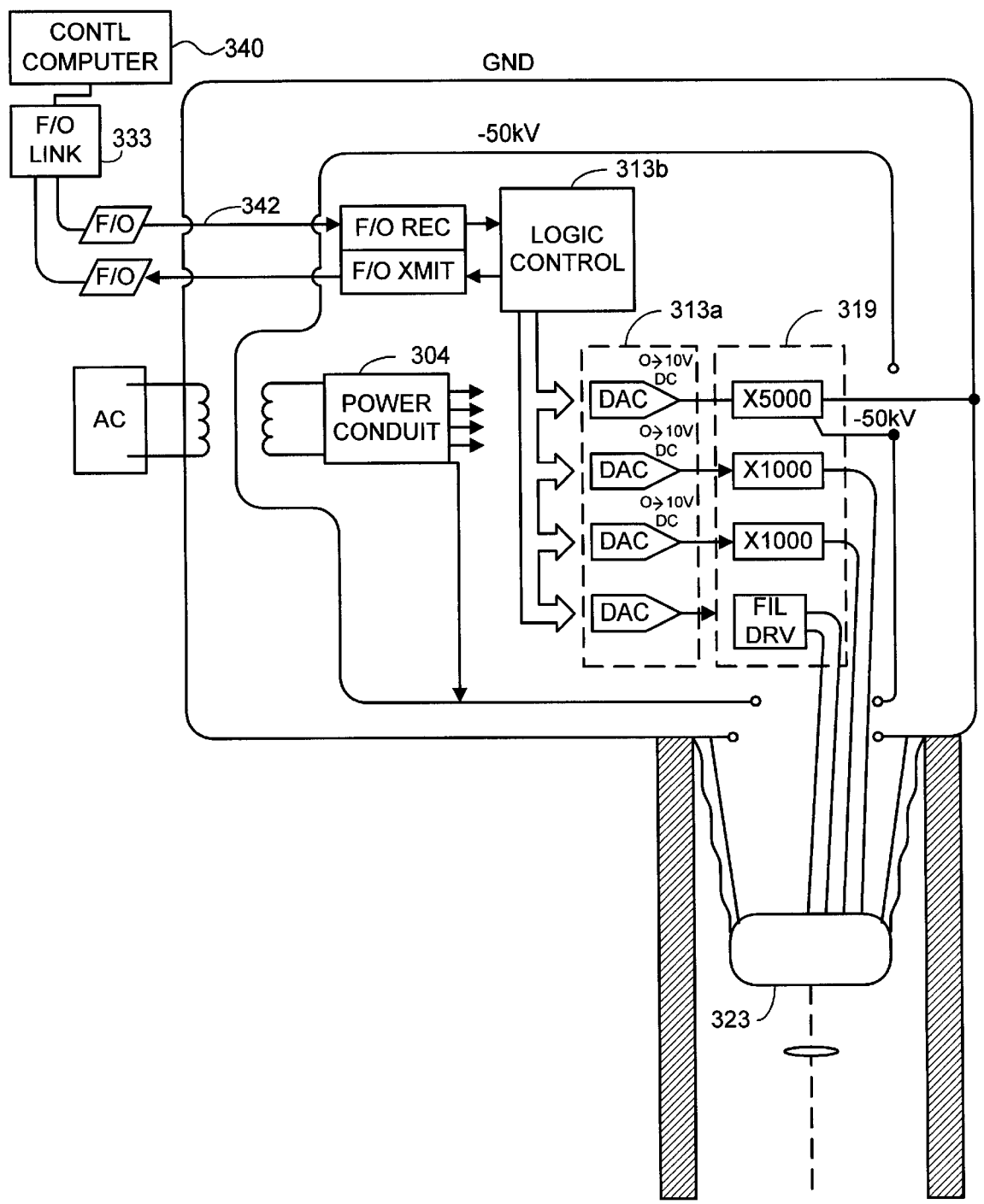
FIG. 3B shows in greater detail portions of the embodiment depicted in FIG. 3A.

The portion of the FIG. 3A embodiment inside internal enclosure 306 is shown in greater detail in FIG. 3B, but is very similar to what is described for the FIG. 2 embodiment. Power and conditioning circuits 304 convert the voltage from the secondary winding of an AC transformer 302, which is on the order of 120 V, for example, to a lower DC voltage, on the order of −15 V to 24 V.

All but one of the output terminals of power and conditioning circuits 304 are electrically connected to input terminals of active control circuits 313. One output terminal is electrically connected to ground within the internal enclosure 306 (which is at a potential of, for example, −50 kV). The active control circuits 313 are conventional and may be for example, on printed circuit boards and include digital to analog signal converters, and a logic control module which interfaces with the control computer. The digital to analog signal converters, in turn, have output terminals which are electrically connected to the input terminals of the high voltage multiplying circuits that are part of the high voltage electronics section 319. Interface with the control computer 340 is provided via fiberoptic cable 342 and a fiberoptic communications link 313, which permits the active control circuits 213 to both transmit data to and receive data from the control computer (not shown).

The high voltage electronics section 319 includes a plurality of high voltage multiplying circuits having feedback elements, and a filament drive which applies a current to the electron emitter 323. The input terminals of the high voltage multiplying circuits receive an analog signal ranging from 0 V to 10 V from the output terminals of the digital to analog signal converters (DACs), and increase this voltage on the order of 1,000 to 5,000 times as shown, so that the signal from the output terminals of the high voltage multiplying circuits ranges from 0 V to 50,000 V. The output of the high voltage multiplying circuit having the highest voltage (the 50,000 V unit, for example) is connected to ground within the internal enclosure 306 (which is at a potential of, for example, −50 kV) and to true ground at the housing 309 as shown. Thus, power conditioning and control circuits 304 and active control circuits 313 are contained within an internal enclosure 306 which "floats" at a high voltage, typically 50 kV.

The output terminals of the other high voltage multiplying circuits (typically at 10 kV) are electrically connected to the electron emitter 323 by soldered wiring. Alternatively, a mating connector (not shown) is used to electrically connect the high voltage electronics 319 with the electron emitter assembly 323. Feedback elements which maintain the stability of the high voltage signal from these high voltage multiplying circuits are conventional and are placed downstream of the output terminals in a standard amplifier feedback arrangement. A low pass filter is optional and can also be added downstream of the output of the high voltage multiplying circuits to improve noise characteristics.

Of course, the high voltage design considerations discussed for the embodiment shown in FIG. 2 apply to the FIG. 3A, and FIG. 3B embodiments.

In all embodiments, the integrated gun and electronics module itself is preferably cylindrical in shape, because that is the shape of the electron beam column upon which it is mounted. However, other configurations are possible. The electron emitter in the invention, is, for example, a thermal field emission (TFE) device, or a photocathode device, but is not so limited.

Figure 4:
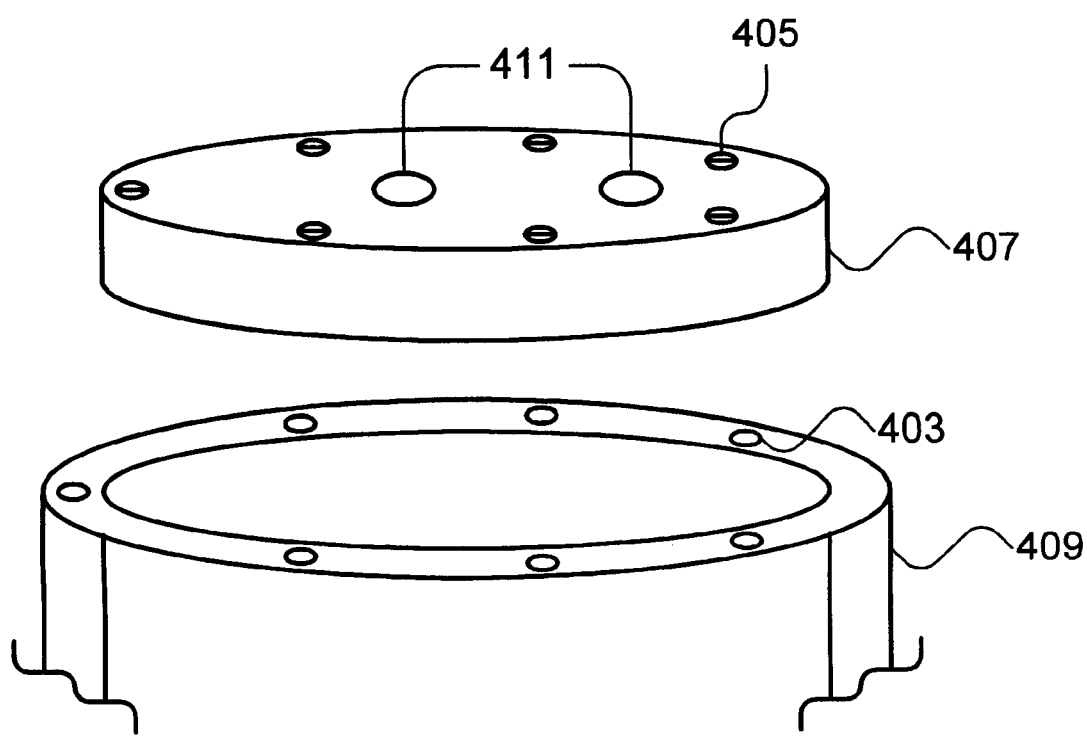
FIG. 4 shows a removable cap mounted on the housing for the embodiments depicted in FIG. 2 and FIG. 3.

FIG. 4 shows in a plan view the removable cap of both embodiments. The removable cap 407 and the top of the wall of the metal enclosure 409 are predrilled with a plurality of mating holes 403 into which screws 405 or other fasteners are placed to fasten the removable cap to the top of the metal enclosure. Feedthrough access ports 411 are also provided.

This disclosure is illustrative and not limiting; further modifications will be apparent to one skilled in the art and are intended to fall within the scope of the appended claims.

I claim:

1. An electron gun assembly comprising:
an electron emitter mounted on an electron beam column;

a power supply module coupled electrically to said electron emitter and including:
  a power source;
  power conditioning and control circuits;
  active control circuits; and
  high voltage electronic circuits; wherein said power source is electrically connected to the input terminals of said power conditioning and control circuits; the output terminals of said power conditioning and control circuits are electrically connected to the input terminals of said active control circuits; the output terminals of said active control circuits are electrically connected to the input terminals of said high voltage electronic circuits; and the output terminals of said high voltage electronic circuits are electrically connected to the electron emitter.

2. The electron gun assembly of claim 1 further comprising a conductive enclosure for said power supply module.

3. The device of claim 2 wherein said enclosure includes a removable cap fitting on a top of said metal enclosure.

4. The device of claim 3 wherein said removable cap defines at least one port through which cables providing electrical power and control signals are passed and electrically connected to said active control circuits.

5. The electron gun assembly of claim 2 wherein said active control circuits are electrically isolated from said conductive enclosure by insulating material.

6. The electron gun assembly of claim 5 wherein said insulating material comprises standoffs of potting epoxy.

7. The electron gun assembly of claim 2 wherein said high voltage electronic circuits are electrically isolated from said conductive enclosure by insulating material.

8. The electron gun assembly of claim 7 wherein said insulating material is chosen from the group consisting of HV gel, oil, or Fluorinert™.

9. The electron gun assembly of claim 2 wherein said electron emitter is electrically isolated from said conductive enclosure by insulating material.

10. The electron gun assembly of claim 9 wherein said insulating material is ceramic.

11. The electron gun assembly of claim 1 wherein said active control circuits comprise:
  an interface to a control computer; and
  a plurality of digital to analog converters; wherein output terminals of said interface are electrically connected to input terminals of said plurality of digital to analog converters.

12. The electron gun assembly of claim 1 wherein said high voltage electronic circuits comprise:
  high voltage multiplying circuits; and
  feedback elements, wherein output terminals of said high voltage multiplying circuits are electrically connected to input terminals of said feedback elements, and output terminals of said feedback elements are electrically connected to input terminals of said high voltage multiplying circuits.

13. The electron gun assembly of claim 1 wherein said high voltage electronic circuits are electrically connected to said electron emitter by wiring which is soldered to terminals of said circuits.

14. The electron gun assembly of claim 1 wherein said high voltage electronic circuits are electrically connected to said electron emitter by a mating connector.

15. The electron gun assembly of claim 1, wherein said active control circuits are electrically coupled to said high voltage electronic circuits by wiring which is soldered to terminals of said circuits.

16. The electron gun assembly of claim 1, wherein said active control circuits are electrically coupled to said high voltage electronic circuits by a mating connector, whereby said active control circuits may be disconnected and removed from the remainder of said assembly.

* * * * *